United States Patent [19]

Tamida

[11] Patent Number: 5,408,951
[45] Date of Patent: Apr. 25, 1995

[54] METHOD FOR GROWING SILICON CRYSTAL

[75] Inventor: Akiteru Tamida, Santa Clara, Calif.

[73] Assignee: MEMC Electronic Materials, Inc., St. Peters, Mo.

[21] Appl. No.: 95,759

[22] Filed: Jul. 21, 1993

[51] Int. Cl.$^6$ ............................................ C30B 15/04
[52] U.S. Cl. ........................................ 117/17; 117/13; 117/19; 117/20
[58] Field of Search .................... 117/13, 17, 19, 20

[56] References Cited

U.S. PATENT DOCUMENTS

4,097,329  6/1978  Stock et al. ............................ 117/13
4,134,785  1/1979  Lavigna et al. ....................... 117/20

FOREIGN PATENT DOCUMENTS

2229789  9/1990  Japan ........................... 156/DIG. 64

OTHER PUBLICATIONS

6-3 Methods of Doping; Silicon Semiconductor Technology (Texas Instruments Electronics Series); Runyan; pp. 114-116.

Primary Examiner—R. Bruce Breneman
Assistant Examiner—Felisa Garrett

[57] ABSTRACT

In an improved Czochralski process for growing silicon crystals, wherein a single-crystal silicon seed is pulled from a molten silicon source to grow the crystal therefrom, a pre-oxidized arsenic dopant is added to the molten silicon source to alter an electrical property of the grown crystal. The pre-oxidized arsenic dopant includes granular particles of metallic arsenic having a surface film of arsenic oxide, the surface film having a thickness of ten microns to one millimeter. After doping, the molten silicon source is moved from the grown crystal, and an applied temperature is increased to burn excess pre-oxidized dopant.

10 Claims, 2 Drawing Sheets

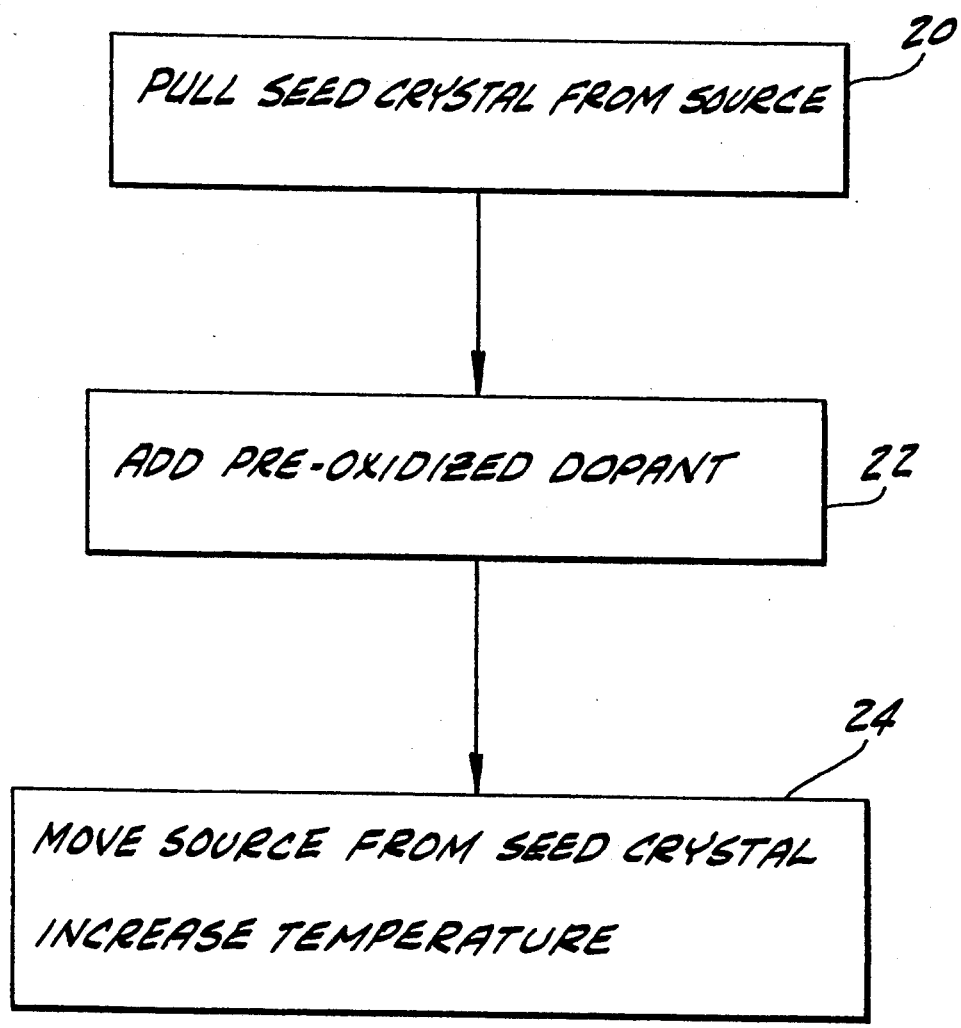

5,408,951

METHOD FOR GROWING SILICON CRYSTAL

BACKGROUND OF THE INVENTION

1. Field of the Invention

The invention relates to semiconductor processing, particularly to techniques for growing silicon crystal.

2. Description of the Background Art

Single-crystal silicon is used commonly as the starting material for fabricating integrated circuits. A typical technique for producing single-crystal silicon is the so-called Czochralski process, whereby a small single-crystal seed is dipped into molten silicon and slowly withdrawn, typically while simultaneously rotating the crystal. In this way, the single crystal is grown into a larger silicon crystal or boule.

To produce high-quality silicon crystals, certain conditions that affect crystal growth are carefully controlled, such as temperature, pressure, impurities, and pull rate. In addition, certain impurities may be intentionally introduced into the molten silicon, as "dopants," to alter the electrical characteristic of the resulting crystal. But sometimes, impurities unintentionally contaminate the molten silicon such that crystal growth is disrupted, typically by the impurities precipitating at interstitial or vacant sites, thereby stressing the crystal lattice.

Accordingly, there is a need to improve conventional Czochralski processing by reducing disruption of crystal growth caused by impurities.

SUMMARY OF THE INVENTION

The invention resides in improving a Czochralski process for growing a silicon crystal, particularly by adding a pre-oxidized arsenic dopant to a molten silicon source. The arsenic dopant comprises either metallic arsenic or a metallic arsenic and silicon compound and is prepared with a film of surface oxide. The surface film has a preferred thickness ranging from 10 microns to 1 millimeter. Excess pre-oxidized dopant may be burned off by moving the molten silicon source away from the grown crystal and then increasing an applied temperature.

BRIEF DESCRIPTION OF THE DRAWINGS

FIG. 2 is a simplified flow chart of a process for growing and doping silicon crystal.

DESCRIPTION OF THE PREFERRED EMBODIMENT

Figure 1:
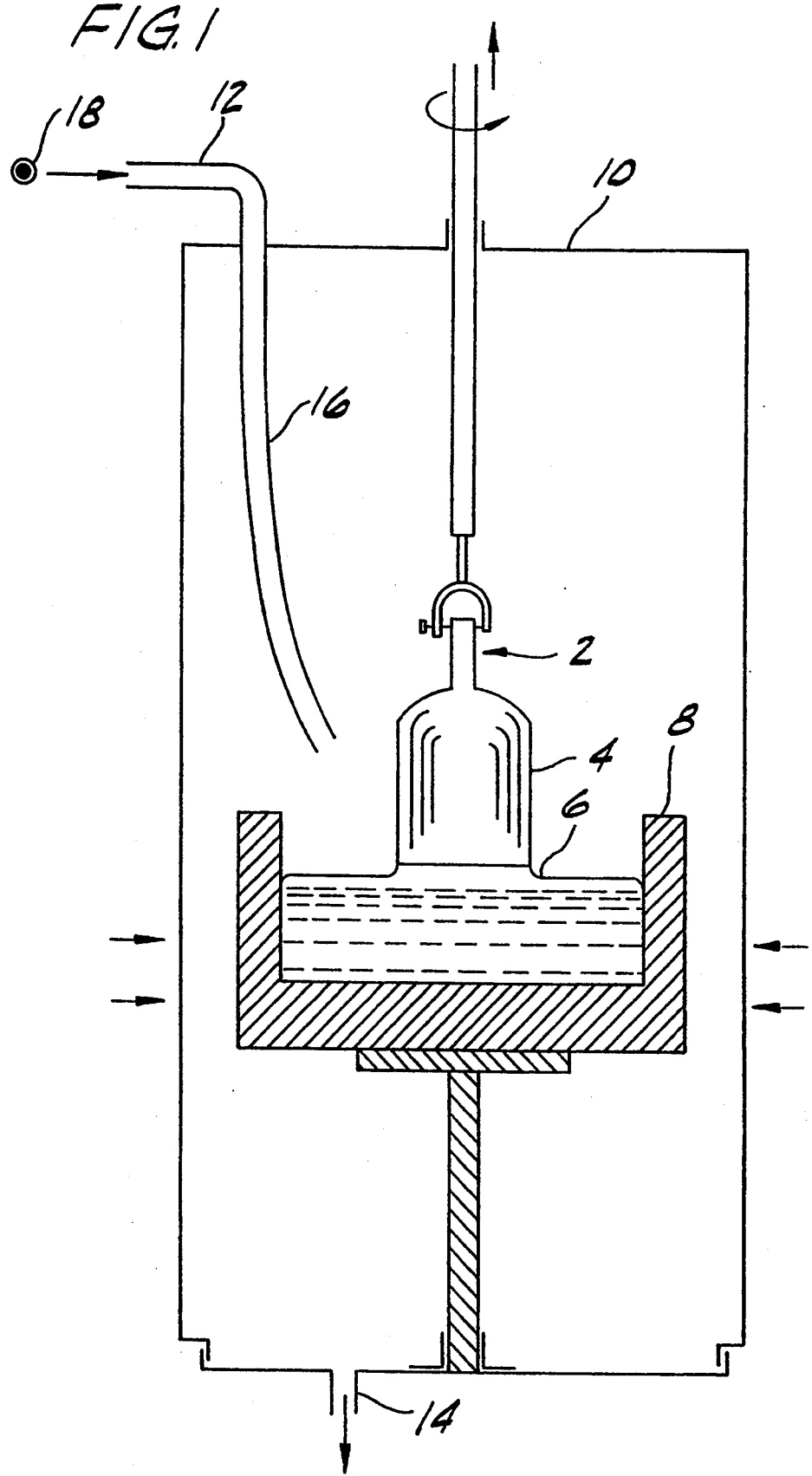
FIG. 1 is a simplified diagram of a system for growing and doping silicon crystal.

FIG. 1 is a simplified diagram of a system for growing and doping silicon crystal according to conventional Czochralski technique. As shown, seed 2 of single-crystal silicon is dipped in molten silicon 6 contained in heated and rotating quartz or graphite crucible 8. Seed 2 is grown into ingot or boule 4 of larger single-crystal silicon by slowly pulling and rotating seed 2 away from molten silicon 6.

The system is provided in temperature and pressure-controlled enclosure 10 having inlet 12 and outlet 14, which respectively receive and release inert gas, such as Argon, to control furnace pressure. Feeding tube 16 is coupled to inlet 12 to direct incoming dopant 18, such as arsenic, into molten silicon 6 to alter electrical characteristic of grown crystal 4.

Preferably, dopant 18 is an arsenic material providing a concentration in grown crystal 4 substantially in the range of $10^{15}$ to $10^{20}$ cm$^{-3}$. Because the vaporizing temperature for arsenic is relatively low, arsenic dopant 18 is added after silicon 6 has been melted to reduce loss of dopant 18 through evaporation, thereby facilitating improved resistivity control of ingot 4.

FIG. 2 shows a simplified flow chart of an improved Czochralski process 20, 22, 24. In accordance with the present invention, the process is modified by adding 22 pre-oxidized or surface-coated dopant 18 to molten silicon 6. In this way, oxidation or other impurities which may be introduced undesirably in dopant 18 and molten silicon 6 are thereby excluded.

In particular, it is contemplated that such surface oxidation serves to reduce or eliminate the formation in the grown silicon crystal 4 of oxide bubbles. Thus, for example, by pre-oxidizing the surface of arsenic dopant 18, metallic reaction by such arsenic with oxygen is reduced or eliminated, and the reaction of solid impurity such as surface oxides on dopant 18 is thereby stabilized.

Oxide bubbles may arise during processing as $As_2O_3$ or $AsO$ gas formed from chemical or physical reactions at the solid-liquid interface of crystal 4, particularly where arsenic is highly concentrated. At such locations, oxide bubbles may be generated as molten silicon 6 is solidified (i.e., as a result of a distribution coefficient being less than 1.0). Additionally, oxide bubbles may also arise indirectly from $SiO_2$ contained in quartz crucible 8, whereupon arsenic dopant 18 may react with oxygen obtained therefrom to create various forms of arsenic oxide in molten silicon 6.

When sufficiently large (e.g., having diameter of one to two millimeters,) the oxide bubbles may cause disruption of crystal lattice growth at certain stress points, particularly at the solid-liquid silicon interface, wherefrom slippage may begin, thereby effectively killing crystal growth. By pre-oxidizing the surface of dopant 18, metallic reaction of arsenic with oxygen is reduced or eliminated, and the reaction of any solid oxide impurity with the oxide on the dopant surface is stabilized.

In the present embodiment, dopant 18 is a metallic arsenic or metallic arsenic and silicon compound, preferably provided as grains or particles having one to four millimeter diameter. Such dopant form is covered on its outer surface with a film of arsenic oxide, preferably having a film thickness of 10 microns to 1 millimeter.

Pre-oxidation of dopant 18 is achieved by treating dopant 18 to atmospheric conditions at room temperature for one day to two weeks. Pre-oxidation is also achieved by exposing dopant 18 to oxygen at elevated temperature and/or pressure conditions sufficient to form the desired outer oxide film thickness.

Thus, as shown in FIGS. 1 and 2, silicon is grown when single-crystal seed 2 is dipped and pulled 20 while rotating from molten silicon 6. To alter electrical property, such as resistivity, of grown silicon boule 4, dopant 18 is added in the form of pre-oxidized metallic arsenic or metallic arsenic-silicon compound grains, deposited through inlet tube 12, 16.

In one embodiment, four-inch silicon crystal having 111 orientation is grown by adding 100 grams of pre-oxidized dopant to about 20 kilograms of molten silicon material 6 in a 12-inch diameter crucible 8. In another embodiment, six-inch silicon crystal having 100 orientation is grown by adding 130 grams of pre-oxidized dopant to about 30 kilograms of molten silicon material 6 in a 16-inch diameter crucible 8.

After doping 22 the molten silicon source 6, it is desirable to eliminate or reduce oxide impurities therefrom by lowering crucible 8 to move 24 molten silicon source 6 away from grown crystal 4, preferably by ten to 100 millimeters from an initial growing position. Then an applied temperature is increased sufficiently to burn any excess pre-oxidized dopant or oxide impurity, and the temperature is stabilized above the melting point of silicon, preferably with crystal 4 disposed at a desired growth position.

I claim:

1. A method for growing semiconductor crystal comprising the steps of:
    pulling a semiconductor crystal from a molten semiconductor source to grow the semiconductor crystal therefrom; and
    adding a pre-oxidized dopant to the semiconductor source to alter a property of the grown semiconductor crystal.

2. The method of claim 1 wherein:
    the semiconductor crystal comprises a single-crystal seed of silicon, and the molten semiconductor source comprises primarily of silicon.

3. The method of claim 1 wherein:
    the pre-oxidized dopant comprises an oxide-covered metallic arsenic.

4. The method of claim 1 wherein:
    the pre-oxidized dopant comprises an oxide-covered metallic arsenic and silicon compound.

5. The method of claim 1 wherein:
    the pre-oxidized dopant comprises a grain of arsenic having a surface of arsenic oxide.

6. The method of claim 1 wherein:
    the pre-oxidized dopant is covered with an oxide film having a thickness of ten microns to one millimeter.

7. The method of claim 1 wherein:
    the dopant is pre-oxidized by keeping such dopant under atmospheric conditions at room temperature for at least one day.

8. The method of claim 1 further comprising the steps of:
    moving the semiconductor source from the grown crystal; and
    increasing an applied temperature to burn excess pre-oxidized dopant.

9. An improved Czochralski process for growing a silicon crystal, the process comprising the steps of:
    pulling a single-crystal silicon seed from a molten silicon source to grow the crystal therefrom; and
    adding a pre-oxidized arsenic dopant to the molten silicon source to alter an electrical property of the grown crystal, the pre-oxidized arsenic dopant comprising a grain of metallic arsenic having a surface film of arsenic oxide, the surface film having a thickness of ten microns to one millimeter.

10. The process of claim 9 further comprising the steps of:
    moving the molten silicon source from the grown crystal; and
    increasing an applied temperature to burn excess pre-oxidized dopant.

* * * * *